United States Patent [19]
Moe et al.

[11] Patent Number: 5,239,685
[45] Date of Patent: Aug. 24, 1993

[54] PROCESS FOR FABRICATING A MMIC HYBRID DEVICE AND A TRANSCEIVER FABRICATED THEREBY

[75] Inventors: Douglas H. Moe, Oceanside; Clarence L. Bruckner; Richard C. Dewey, both of San Diego; Douglas L. Dunn, Chula Vista, all of Calif.

[73] Assignee: Qualcomm Incorporated, San Diego, Calif.

[21] Appl. No.: 773,066

[22] Filed: Oct. 8, 1991

[51] Int. Cl.$^5$ .............................. H04B 1/38
[52] U.S. Cl. ...................... 455/73; 455/333
[58] Field of Search .............. 455/73, 84, 77, 333

[56] References Cited

U.S. PATENT DOCUMENTS

| | | | |
|---|---|---|---|
| 4,016,493 | 4/1977 | Gross | 455/73 |
| 4,383,273 | 5/1983 | Lunn | 455/333 |
| 4,384,367 | 5/1983 | King et al. | 455/333 |
| 4,495,648 | 1/1985 | Giger | 455/73 |

OTHER PUBLICATIONS

"Thick Film Techniques for Microwave Intergrated Circuits" by Ted M. Foster et al. *IEEE Transaction on Parts, Hybrids and Packaging*, vol. PHP-10, No. 2, Jun. 1974, pp. 88–94

"Thin-Film Design Guidelines for Microwave Circuitry" by Michael D. Casper, *Microwave Journal*, Oct. 1988, pp. 129–131.

"Ku-Band MMIC Upconverter for Mobile Satellite Communications" by Douglas L. Dunn et al, *GaAs IC Symposium*, pp. 271–273.

"Advance Product Information and Technical Brief" brochure relating to Ku-Band DBS MMIC Downconverter, Anadigics, Inc.

"Thin Film Substrate Standards and Specifications" by Coors Ceramic Company.

"Fujitsu Super Low Noise Hemt-FHX Series" Preliminary Specification.

NEC 14GHz Divide-by-8 Prescaler Preliminary, pp. 5–1 to 5–4.

Electro-Science Laboratories, Inc. Dielectric Composition Specification Sheet.

"Electro-Science Laboratories, Inc. Palladium-Silver Metalization and Conductive Coatings", Bulletin No. 92278.

"Electro-Science Laboratories, Inc. #9638 Pd/Ag Conductor" Specification Sheet.

DuPont Birox Thick Film Resistor Compositions—Series 17 Resistor Compositions Specification Sheet.

EMCA-REMEX Products Capacitor Overglaze 7527 Technical Information.

DuPont Thick Film Conductor Compositions, Gold Conductor Compositions 5715, Microcircuit and Multilayer Interconnect Hybrids.

*Primary Examiner*—Reinhard J. Eisenzopf
*Assistant Examiner*—Timothy H. Keough
*Attorney, Agent, or Firm*—Russell B. Miller

[57] ABSTRACT

The substrate for implementation of MMIC devices comprises alumina with feedthrough holes drilled therein to provide conduct ion paths from the top surface of the substrate to the bottom surface. A high-temperature to low-temperature fabrication process is used to form circuit traces and components upon the substrate. Each of the thick film deposition processes is followed by a firing process to remove organic materials from the deposited material and to secure the material to the substrate or previous layer. A Ku-band transceiver constructed using the process includes the attachment of six discrete, unpackaged MMIC's and one HEMT. All other devices and traces are patterned on the substrate and the discrete components are directly attached to pads on the substrate.

5 Claims, 5 Drawing Sheets

PROCESS FOR FABRICATING A MMIC HYBRID DEVICE AND A TRANSCEIVER FABRICATED THEREBY

BACKGROUND OF THE INVENTION

Commerical high-volume microwave systems require highly-integrated circuits in order to make production of the system practical. The use of monolithic microwave integrated circuits (MMIC's) is critical to achieving this goal. For the past 30 years, microwave integrated circuits (MIC's) have relied heavily upon thin film technology for patterning of conduce, resistive, and insulating films on a ceramic substrate. The films are either deposited selectively as the circuit pattern or applied as an entire film and then masked and selectively etched to the desired circuit patterns. Thus, with the trend toward Ku-band communication systems, the devices have incorporated discrete capacitors, resulting in MIC's with a large number of discrete components. As a specific example, a MIC Ku-band upconverter fabricated using thin film technology includes on the order of 80 discrete components assembled with the substrate. The necessity of including these discrete capacitors and integrated circuits results in large, relatively heavy devices which are labor intensive, considering the number of discrete components which must be added after the processing of the substrate itself. Looking again at the Ku-band upconverter, the area required is approximately 4700 mm$^2$.

In addition to the large devices, thin film processing, while providing a great deal of precision in patterning, has several other disadvantages. Among these are the fact that deposited or sputtered conductor material is wasted by coating the inside of a vacuum chamber (i.e., a significant amount of gold is wasted), the ability to produce thick layers (greater than 0.5 mil) is limited, processing equipment is costly and cleanliness is critical so that expensive environmentally controlled facilities are required.

Thick film technology is well known for production of integrated circuit packaging and discrete components. The techniques and equipment required for thick film technology are significantly less stringent and less expensive than those for thin film processing. Further, thick film components can provide capacitors capable of operating at Ku frequencies. Thus, a thick film capacitor can provide the same capacitance values as those of discrete capacitors used with thin film processed substrates.

With the increase in the use of satellites for communications systems, the need is clear for reduced size and weight of components. It would, therefore, be desirable to provide an assembly which provides reduced size and weight which is capable of meeting the low loss requirements of microwave circuits. The process and devices of the present invention are directed toward attaining such a goal.

SUMMARY OF THE INVENTION

It is an advantage of the present invention to provide a process for forming a substrate for implementation of MMIC's which allows size and weight reduction of the device.

It is a further advantage of the present invention to provide a process for economically fabricating MMIC-based hybrid units.

It is still another advantage of the present invention to provide a process for high volume commercial production of MMIC-based hybrid units.

Yet another advantage of the present invention is to provide a Ku-band transceiver in an ultra-small lightweight package.

In an exemplary embodiment, the substrate for implementation of MMIC devices comprises alumina with feedthrough holes drilled therein to provide conduction paths from the top surface of the substrate to the bottom surface. A high-temperature to low-temperature fabrication process is used to form circuit traces and components upon the substrate. Each of the thick film deposition processes is followed by a firing process to remove organic materials from the deposited material and to secure the material to the substrate or previous layer.

A silver paste is deposited on both top and bottom surfaces of the substrate. The conductive paste is silk-screened in circles centered on the feed through holes. During the screening operation, a vacuum is pulled from one side to cause the silver to flow through the holes and complete an electrical feedthrough from contacts on the top surface to the bottom surface of the substrate. The substrate is then fired at 980° for ten minutes.

A pattern of conductive gold paste is silkscreened on the top surface of the substrate to define circuit traces and various circuit elements. This pattern is slightly larger than desired to permit "trimming". The gold pattern is fired at 980° for ten minutes. The gold pattern is then covered with a photoresist to create a mask protecting portions of the traces and elements which are to remain. The photoresist patterning and etching process trims the traces and elements for precise width and boundaries.

Thick film capacitors are formed upon capacitor electrodes defined by the gold pattern. Typically, three silkscreened prints and firing steps are used to form the capacitors. A capacitor top electrode is then formed by silkscreening a gold pattern over the capacitor dielectric material. The gold pattern is fired at 900° C. for 10 minutes.

The top and bottom surfaces of the substrate are silkscreened with a pattern of palladium silver to define additional traces and circuit elements on the top surface and the ground plane on the bottom surface. The assembly is then fired at 850° C. for ten minutes. Resistors are formed between appropriate electrodes by silkscreening thick film resistor ink. The resistors are then laser trimmed using a YAG laser to provide the appropriate resistor values. Different values of resistor ink are used sequentially, with a firing procedure being performed at 850° C. for ten minutes following each deposition.

The capacitors are sealed with a protective glass layer which is then fired at a temperature of 560° C. to 600° C. Slots and cutouts may be made in the substrate using a $CO_2$ laser to enable mounting of MMIC's and RF shields over certain traces.

The alumina substrate is mounted on an aluminum carrier using a conductive epoxy. MMIC's and Discrete IC components are mounted directly upon the pads of the substrate using conductive epoxy to bond the devices to the substrate traces/pads which electrically connect the IC's to the ground via feed through holes in the substrate to the ground plane. Wire bonding techniques are used to connect device IC pads to the substrate circuit pads. Certain other MMIC's and IC die components are mounted upon molybdenum tabs using a conductive epoxy or eutectic preform. The molydenum tabs are placed in cutouts in the substrate and adhere to the aluminum carrier with a conductive epoxy. Wire bonding techniques are used to electrically connect the IC pads to the appropriate substrate circuit pads.

A Ku-band transceiver constructed using the above process includes the attchment of seven discrete, unpackaged MMIC's and one high election mobility transistor (HEMT). All other devices and traces are patterned on the substrate as above, and the discrete components are directly attached to pads on the substrate. This transciever occupies approximately 53% of the area of its thin film substrate/discrete component counterpart.

BRIEF DESCRPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which.

DESCRIPTION OF THE PREFERRED EMBODIMENT

Figure 1:
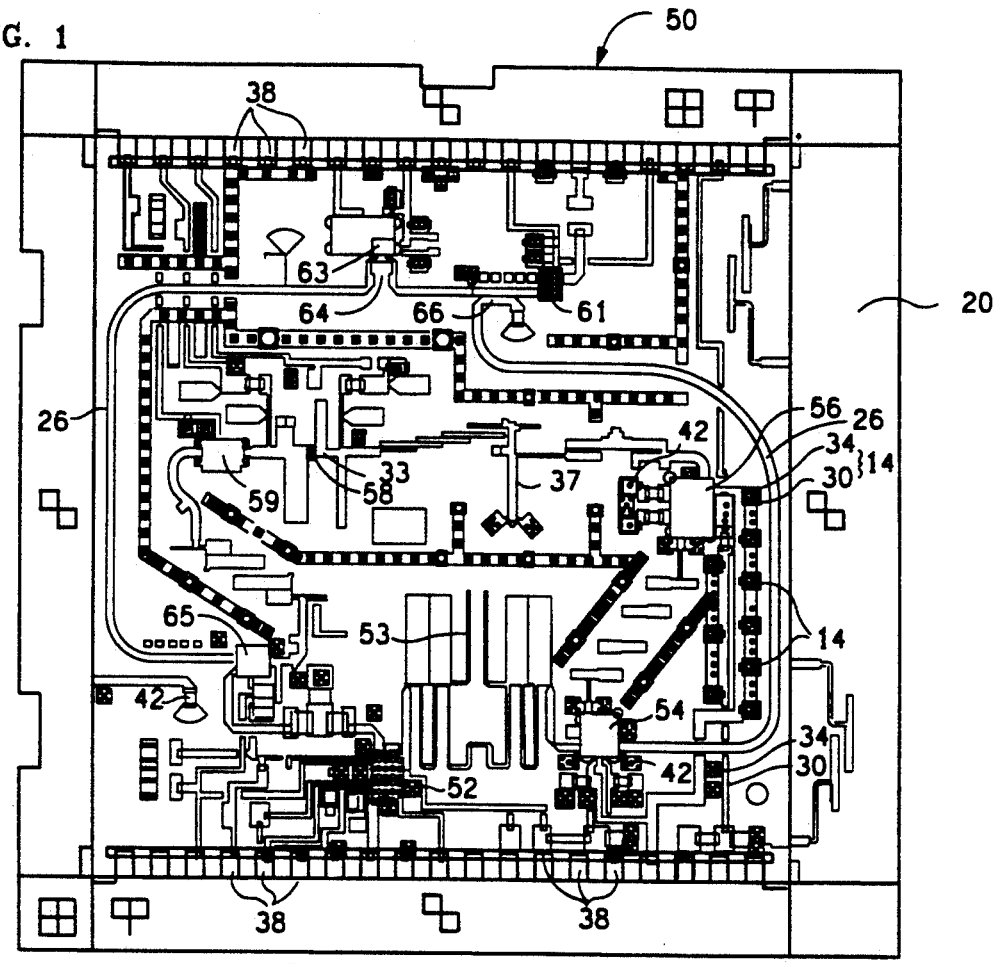
FIG. 1 is a layout of a Ku-band transceiver processed according to the present invention.

In FIG. 1, a Ku-band transceiver processed according to the inventive process is illustrated. Traces 26, electrodes 30, 34 and pads 38 are patterned on the substrate using thick film conductive pastes. Capacitors 14 are formed by silkscreening thick film dielectric paste onto certain electrodes. Resistors 42 are formed using commercially-available thick film resistor ink. Discrete IC's 52, 54, 56, 59, 61, 63 and 65 are wire bonded to pads on the substrate 20.

The substrate 20 for implementation of MMIC devices comprises alumina with feedthrough holes drilled therethrough to provide conduct ion paths from the top surface of the substrate to the bottom surface. A high temperature to low-temperature fabrication process is used to form circuit traces and components upon the substrate. Each of the thick film deposition processes is followed by a firing process to remove organic materials from the deposited material and to secure the material to the substrate or previous layer.

Figure 2A:
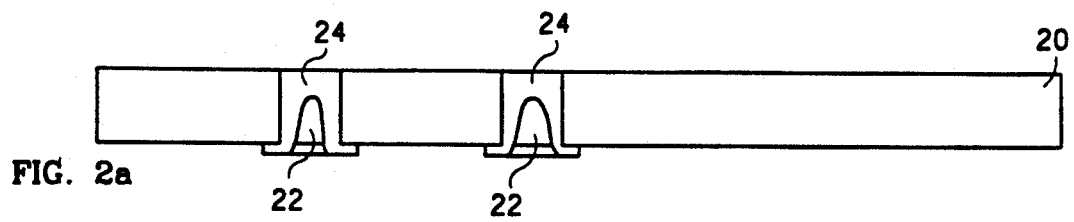
FIGS. 2a-2d are a series of exemplary side views that depict the successive processing step.

A palladium/silver (Pd/Ag) paste is deposited on both top and bottom surfaces of the substrate 20. The conductive paste is silkscreened in circles centered on the feedthrough holes 22, as illustrated in FIG. 2a. During the screening operation, a vacuum is pulled from one side to cause the silver to flow through and plug the holes 22 on the circuit side to complete an electrical connection 24 from contacts on the top surface to the bottom surface of the substrate. The circuit side of the substrate is then wiped with a tissue and solvent to make the surface flat. The substrate is then fired at 980° for ten minutes.

Figure 2B:
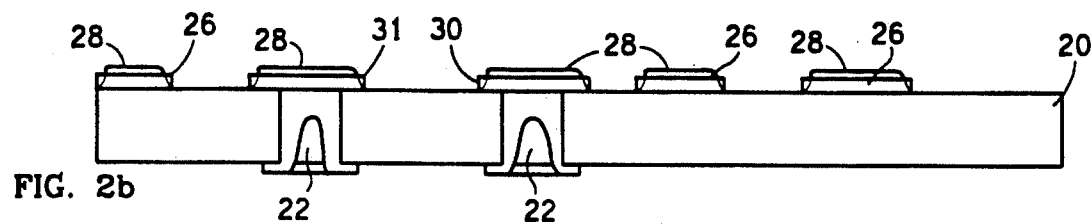

A pattern of conductive gold paste is silkscreened on the top surface of the substrate to define circuit traces 26 and various circuit elements 30, 31. This pattern is slightly larger than desired to permit "trimming" in a subsequent step. The gold pattern is fired at 980° for ten minutes. The gold pattern is then covered with a photoresist (PR) 28 to create a mask protecting portions of the traces and elements which are to remain, shown in FIG. 2b. The PR is then stripped. The photoresist patterning and etching process trims the traces and elements for precise width and boundary definition.

Figure 2C:
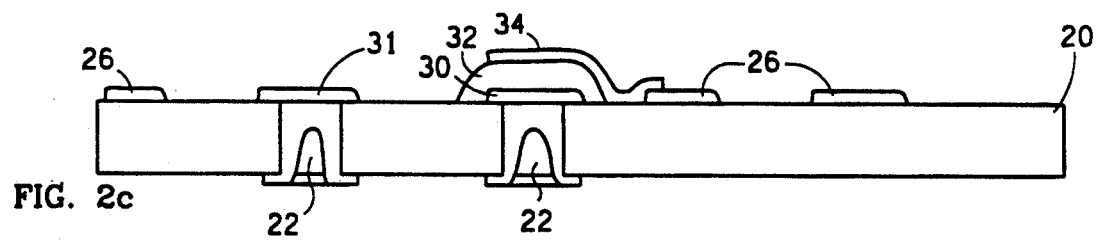

Thick film capacitors are formed upon capcitor electrodes 30 defined by the gold pattern. Typically, three silkscreened prints and firing steps are used to form the capacitors, dielectrics 32, as shown in FIG. 2c. A capacitor top electrode 34 is then formed by silkscreening a gold pattern over the capacitor dielectric material. The gold pattern is fired at 900° C. for 10 minutes.

The top and bottom surfaces of the substrate are silkscreened with a pattern of palladium/silver to define additional traces 36, pads 38 and other circuit elements on the top surface and the ground plane 40 on the bottom surface. The assembly is then fired at 850° C. for ten minutes.

Figure 2D:
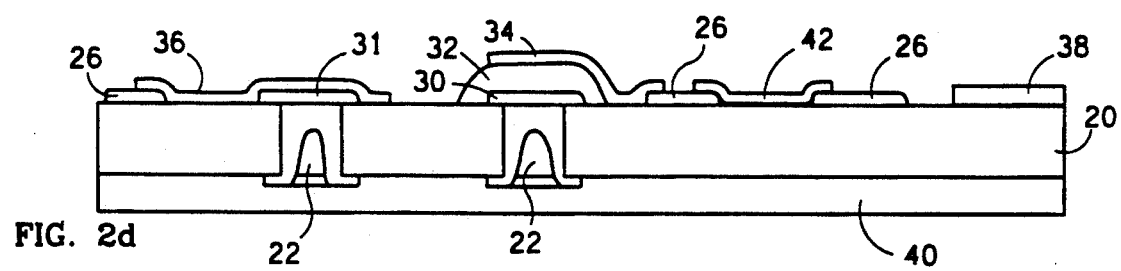

As shown in FIG. 2d, resistors 42 are formed between appropriate electrodes by silkscreening thick film resistor ink. The resistors are laser trimmed using a YAG laser to provide the appropriate resistor values. Different values of resistor ink are used sequentially, with a firing procedure being performed at 850° C. for ten minutes following each deposition.

The capacitors are sealed with a protective glass layer which is then fired at a temperature of 560° C. to 600° C. Slots and cutouts may be made in the substrate using a 602 laser to enable mounting of discrete 16's and RF shields over certain traces.

The alumina substrate 20 is mounted on an aluminum carrier using a conductive epoxy. Discrete IC components are then mounted directly upon the pads of the substrate using conductive epoxy to bond the devices to the substrate traces/pads which electrically connect via feed through holes in the substrate to the ground plane. Wire bonding techniques are used to connect device IC pads to the substrate circuit pads. Certain other IC die components are mounted upon molybdenum tabs using a conductive epoxy or eutectic preform. The molybdenum tabs are placed in cutouts in the substrate and adhered to the aluminum carrier with a conductive epoxy. Wire bonding techniques are used to electrically connect IC pads to substrate circuit pads.

A Ku-band transceiver constructed using the above process includes the attachment of seven discrete, unpackaged MMIC's and one HEMT. All other devices and traces are patterned on the substrate as above, and the discrete components are directly attached to pads on the substrate or to moly tabs attached to the substrate.

Figure 3A:
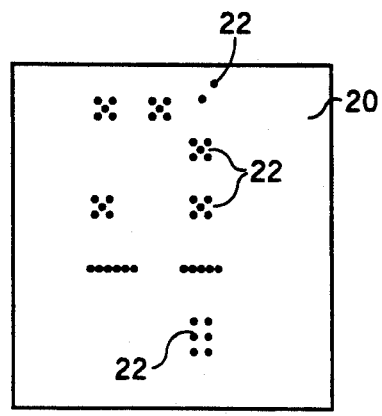
FIGS. 3a-3g are a series of layouts of the successive levels of the process for a portion of the transceiver.

An exemplary Ku-band transceiver assembled according to the above process is illustrated in FIGS. 3a-3g. A functional description is provided below. Following the processing sequence, the ceramic substrate 20 is illustrated in FIG. 3a with vias 22 drilled and with the first conductive paste of Pd/Ag having been silkscreened on both top and bottom of the substrate over the vias and the Pd/Ag being drawn through the vias to plug them with conductive layer 24. The ceramic substrate is alumina with a preferred dielectric constant of 9.9±1%. One such substrate is Coors Ceramic Company ADS-996. A beryllium oxide substrate may also be used but is more expensive. The substrate is typically 2.0"×2.1" (50.8 mm×53.3 mm) and 25 mils (0.64 mm) thick. The vias 22 are preferably no larger than 4 mils (0.1 mm) in diameter.

The Pd/Ag paste used to pattern the 20 mil (0.5 mm) diameter circles is 0.5 mils (12.7 μm) thick. The preferred material is Pd/Ag Coating #9638 manufactured by ESL. While silver is the primary conductor, a small amount of palladium is included to inhibit migration of silver ions during subsequent processing.

Figure 3B:
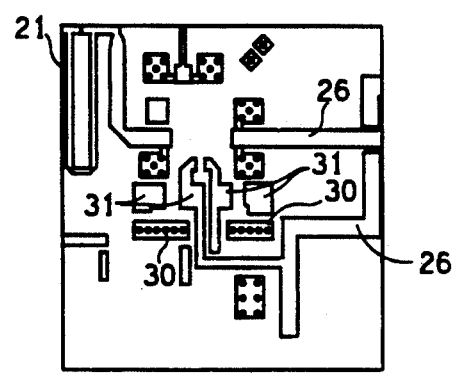

FIG. 3b illustrates the first conductive pattern of traces 26 and circuit elements which have been formed by silkscreening 0.3 mil (7.6 μm) thick gold in a pattern aligned with the vias. The preferred gold conductor is manufactured by E. L. DuPont DeNemours & Co. as Gold Conductor composition 5715. The pattern as deposited is slightly larger in both width and length than the desired end result. The substrate is fired at 980° for 10 minutes to cure the gold and burn off any impurities, after which the substrate is coated with photoresist (PR), and a mask is placed on the surface to cover portions of the traces and circuit elements which are to remain. Potassium iodide solution is used to etch away the exposed PR and gold pattern to fine tune the trace and element width and length. The dotted lines indicate the final dimensions after etch and PR strip. Along with the traces 26, circuit elements that are formed include microwave filters 53, impedance matching circuits 33, diplexer circuits 37, resistor terminations 31 and capacitor electrodes 30, as illustrated in FIGS. 1 and 3.

Figure 3C:
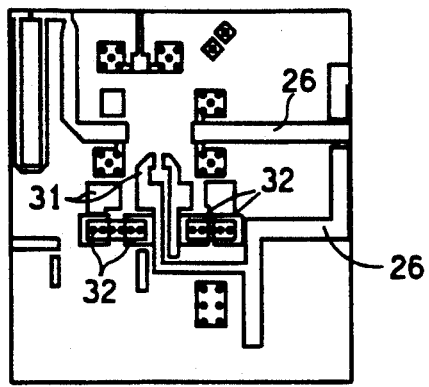

Thick film capacitor paste is silkscreened over selected elements, i.e., capacitor electrodes 30, of the first conductive pattern to form capacitor dielectric 32, as shown in FIG. 3c. Since gold is used for the capacitor electrodes, three prints of the capacitor paste is sufficient, each screening to a thickness of 0.6 mils (15.2 μm). More prints may be needed for different conductors. For example, if silver is used, four prints are made. A firing step is performed at 980° C. for ten minutes after each print. The preferred dielectric material is dielectric composition D-4117 manufactured by ESL.

Figure 3D:
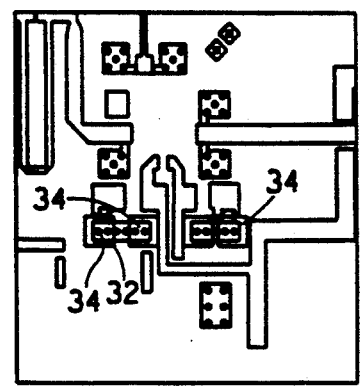

Top electrodes 34 for capacitor dielectrics 32 are also illustrated in FIG. 3d. The silkscreen is aligned with the previous layer and is used to pattern gold conductor paste to a thickness of 0.3 mil (7.6 μm). Again, the preferred material is DuPont 5715. The gold conductor is fired to a temperature of 900° C. for ten minutes.

Figure 3E:
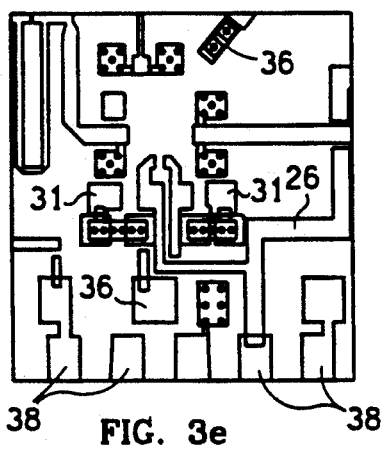
Figure 3F:
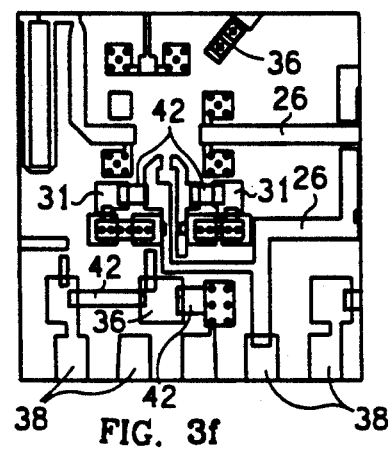

FIG. 3e shows the pattern resulting from silk screening a 0.5 mil thickness of Pd/Ag onto the substrate to form solder pads 38, shields and interconnect 36. On the bottom surface of the substrate, a pattern is silkscreened to form the ground plane, shown in FIG. 2d. The ground plane 40 consists of a layer of Pd/Ag, 1 mil thick over lying the feedthrough holes 22 and associated pads. The preferred material is Pd/Ag conductor #9695 manufactured by ESL. The assembly is then fired at 850° C. for ten minutes. Thick film resistors are formed to bridge the appropriate electrodes, as shown in FIG. 3f. Typically, two resistor inks are used, one of a 1 Kohm/square value and another of 50 ohm/square value. The resistors 42 are silkscreened onto the substrate. The desired resistances are obtained by laser trimming the patterned resistors with a YAG laser. The process sequence is that the 50 ohm resistors are silkscreened to a thickness of 1 mil and fired at 850° C. for ten minutes. The 1 Kohm resistor is then silkscreened followed by firing at 850° C. for ten minutes. The preferred resistor composition is DuPont thick film resistor composition series 17(a blend of 1711 (10 ohm) and 1721 (100 ohm) for 50 ohm resistors, and 1731 for 1 Kohm). For 5 ohm resistors, five times the length of a 1 ohm resistor is used. For intermediate size resistors, the larger resistor value ink is used and printed in smaller areas.

The capacitors are hermetically sealed by silkscreening a glass protective layer over them. The preferred glazing material is manufactured by EMCA REMEX identified as capacitor Overglaze #7527. The assembly is then fired at 560°-600° C.

Figure 3G:
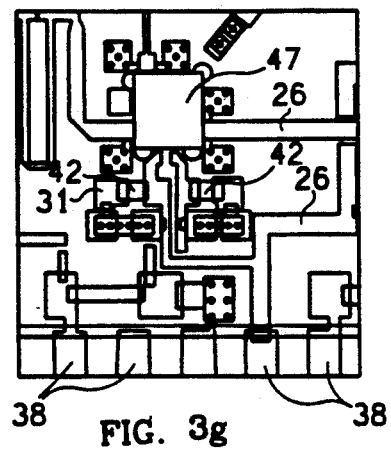

A $CO_2$ laser is used to make slots or cutouts 47 in the substrate, as shown in FIG. 3g for mounting IC devices and RF shields over certain traces.

The substrate assembly is bonded to an aluminum carrier with a conductive epoxy.

Discrete IC die components (unpackaged) are mounted directly on the designated pads, as illustrated in FIG. 1, for coupling of the die substrate to the ground plane by way of the feedthrough holes. A conductive epoxy is used for this procedure.

Several of the discrete components are commercially available including a frequency divider 61 (NEC #UPG506B) and a low noise amplifier (LNA) 59 manufactured by Hughes Aircraft Co. A dual amplifier/switch 52, illustrated in FIG. 4 and described below is custom designed for the present transceiver device. Wire bonding techniques are used to connect device IC pads to the substrate circuit pads.

Molybdenum (Moly) tabs are placed in the cutouts in the substrate and adhered to the aluminum carrier with a conductive epoxy. Additional IC die components are mounted upon the moly tabs using a conductive epoxy or eutectic preform. These IC components include a voltage controlled oscillator 63 (VCO) manufactured by Pacific Monolithics, a power amplifier 56 by Hughes Aircraft Co., and a frequency downconverter 65 by Anadigics (Part No. AKD12010). A frequency upconverter illustrated in FIG. 4 and described below, is custom designed for the present transceiver.

Figure 4:
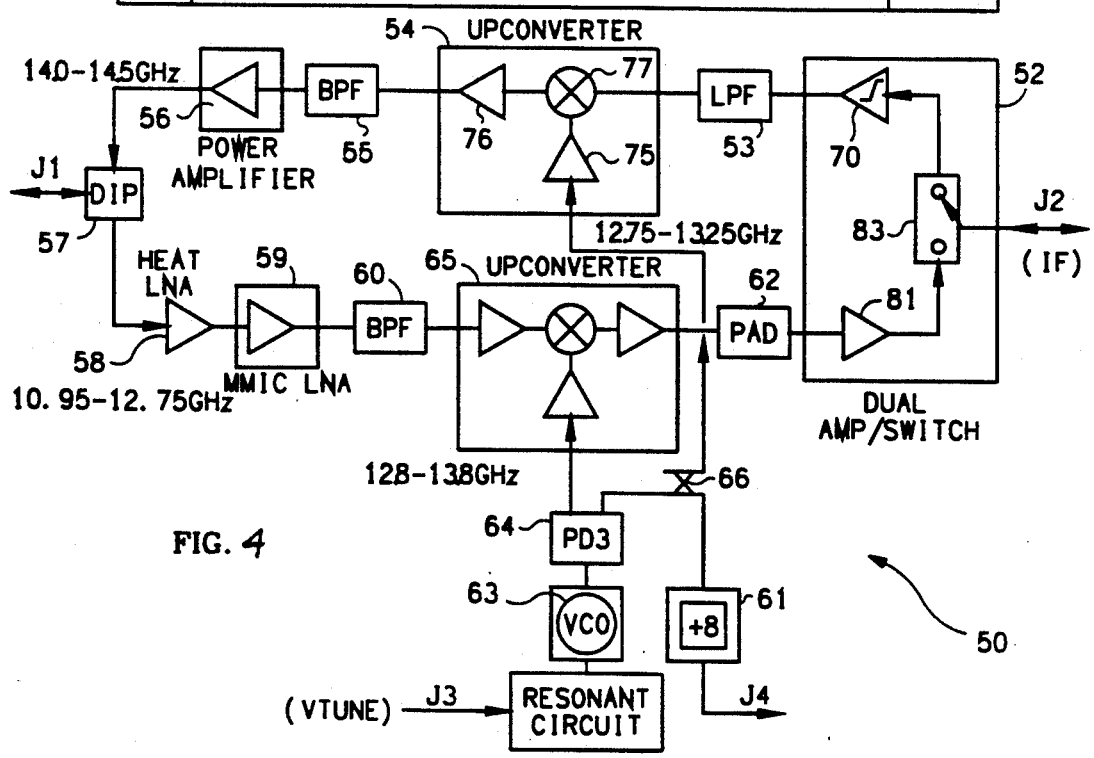
FIG. 4 is a schematic block diagram of the Ku-band transceiver.

The transceiver 50 illustrated in FIG. 4 is a hybrid assembly of seven MMIC,s and one HEMT assembled on the patterned alumina substrate.

In the transmitter mode, dual amplifier switch 52 takes an input IF signal (0.9-1.4 GHz) and directs it through low pass filter (LPF) 53 to upconverter 54. Both dual amp switch 52 and upconverter 54 are novel designs and are described in more detail below. The RF output is filtered by bandpass filter (BPF) 55 to remove noise from the mixer operation within upconverter 54. Power amplifier 56 boosts the power of the RF signal, now at 14.0-14.5 GHz, and diplexer 57 directs the RF signal to the communication system's antenna.

In the receiver mode, the incoming RF signal (in the range of 10.9-12.75 GHz) is directed from the antenna to HEMT low noise amplifier (HEMT LNA) 58, with a 10.5 dB gain, and low noise amplifier (LNA) 59 to provide additional gain. Bandpass filter (BPF) 60 further removes noise and downconverter 65 decreases the signal frequency to the IF range, its output power being attenuated by Tee pad 62 before being output through dual amplifier switch 52. The reference frequency for both upconverter 54 and downconverter 65 is provided by voltage-controlled oscillator (VCO) 63. The reference signal is divided between downconverter 65 and frequency divider 61 by power divided 64. The coupler 66 directs the reference frequency to the upconverter 54.

A simplified block diagram of upconverter 54 is included in FIG. 4. The transmit sequence for the upconverter function is broken into three active device functions and two passive filters: IF limiting amplifier 70, upconverter 54, power amplifier 56, LPF 53 and BPF 55. The upconverter 54 is divided into three subsections: local oscillator (LO) amplifier 75, RF amplifier 76, and mixer 77. The mixer employs an RF balun and two diodes.

The RF balun divides a signal into two equal parts 180° out of phase at 12.8 GHz–14.5 GHz. A Lange coupler is used in the present invention, with a delay line added to increase the 90° phase difference of the Lange coupler to the required 180°.

LO amplifier 75 is a single stage amplifier, a selfbiased FET (300 μm×0.5 μm), which is designed to provide at least 10 dBm of drive power with 0 dBm in. Single stub matching is employed, resulting in an amplifier operating in the range of 12.3 GHz to 13.6 GHz with 12 dB of gain and a 1 dB compression point of 11–12 dBm.

RF amplifier 76 is a four-stage amplifier realized with two 300 μm×0.5 μm FET's, a 600 μm×0.5 μm FET, and a 900 μm×0.5 μm FET output stage, providing 32 dB of small signal gain and 21 dBm output power when driven with the anticipated minimum power level of −8 dBm. This allows the overall output power of the upconverter 54 to overcome the loss caused by BPF 55 and drive the power amplifier 54 into saturation from 14–14.5 GHz.

Mixer 77 consists of two 120 μm×0.5 μm Schottky diodes. This mixer has 9 dB conversion loss with greater than 16.7 dB LO rejection and 20 dB 21F+LO rejection.

As an alternate, an FET mixer can be used. FET mixers in general produce fewer spurious signals. A balanced FET mixer may be used, consisting of two 150 pm×0.5 pm FET's. The mixer itself has 15 dB LO rejection. At 14.9 GHz, the most critical point, the mixer provides 21 dB of 21F+LO rejection. However, to use this mixer successfully, an IF power level of 14 dB minimum would be required. Thus, the diode mixer is preferred.

Upconverter 54 is fabricated on a GaAs substrate using processing techniques as are known in the art. The final upconverter alone measures 2.82 mm×2.68 mm, reducing the area occupied by the upconverter from 4700 mm² to 7.6 mm².

As illustrated in FIG. 4, dual amp switch 52 is fabricated on a GaAs substrate and consists of IF limiting amplifier 70, a five-stage amplifier for providing the IF signal to upconverter 54, IF amplifier 81, a three-stage FET amplifier for amplifying the output IF signal and switch 83 for selecting between transmitter input ($T_x$ in) and receiver output ($R_x$ out).

Figure 5A:
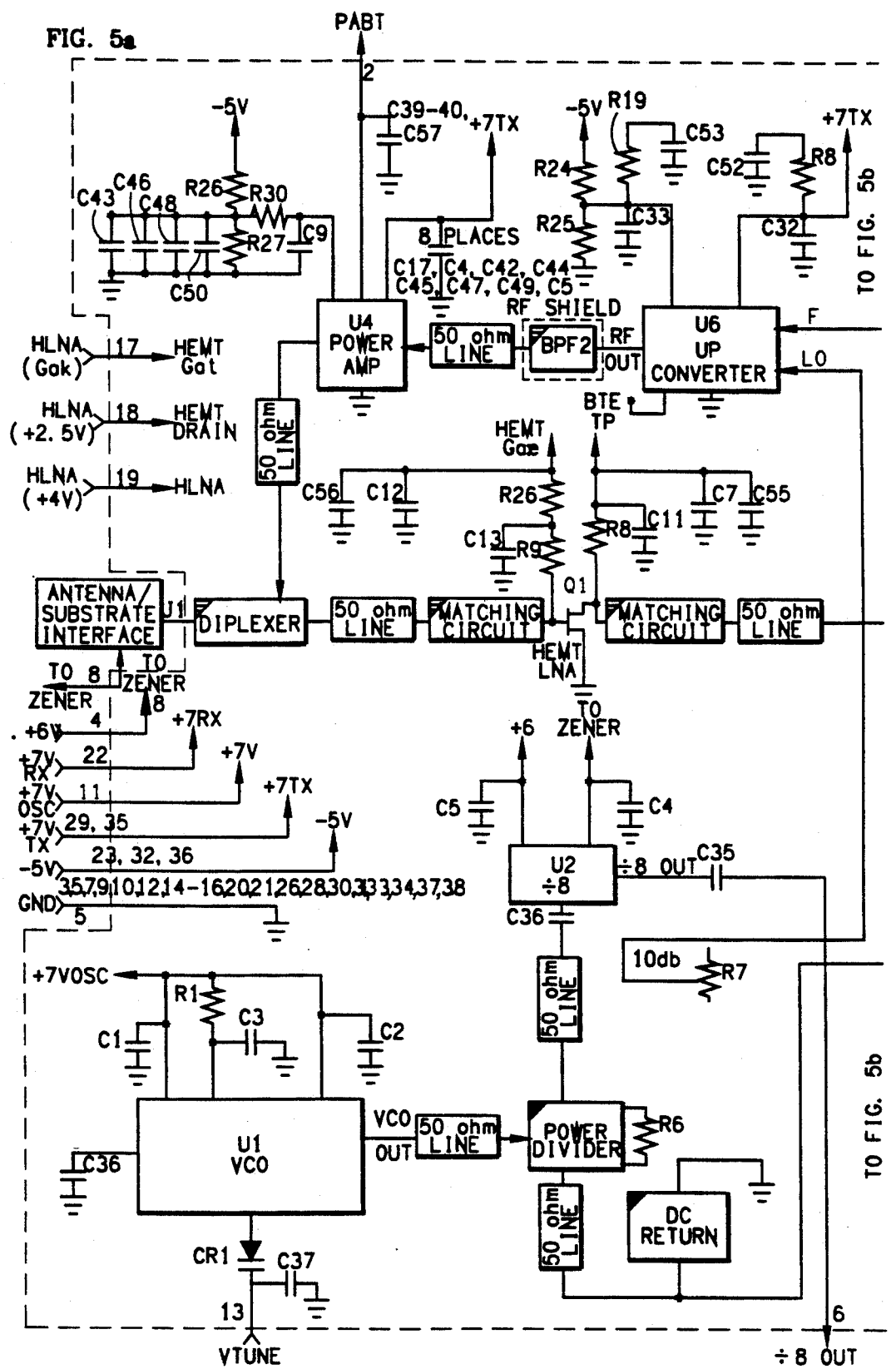
FIGS. 5a and 5b are more detailed schematic block diagrams of the transceiver of FIG. 4.
Figure 5B:
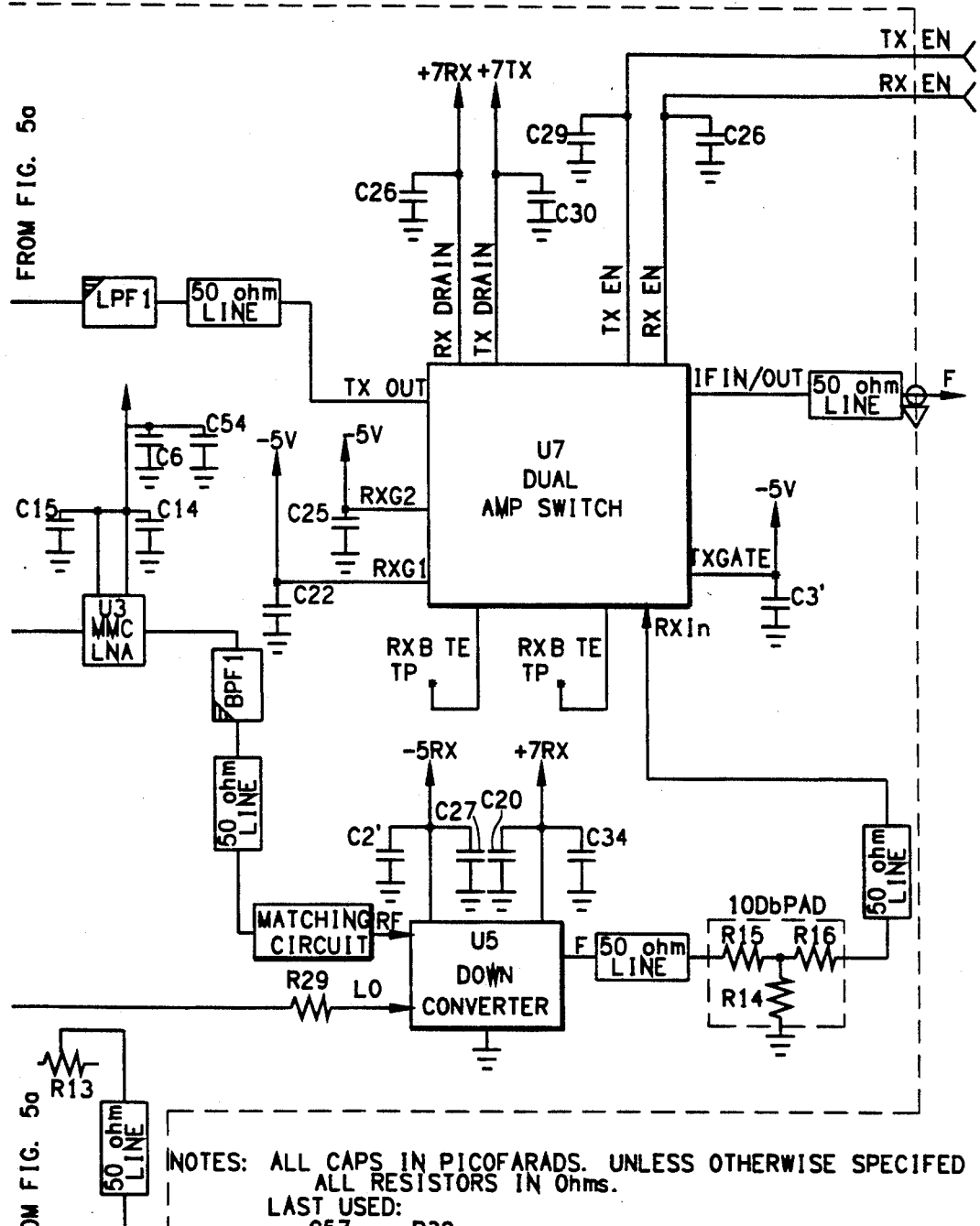

FIG. 5 illustrates in yet further detail a more complete schematical block diagram of the present invention. In FIG. 5 the various components and accompanying circuitry including printed devices are illustrated therein.

The above-described process for patterning a substrate for assembly of a hybrid MMIC permits the fabrication of a Ku-band transceiver for use in a commercial two-way satellite communication system. The MMIC upconverter alone replaces 80 discrete components, helping to reduce the area occupied by the overall transceiver to 5.3% of the currently utilized discrete assembly. The ease of fabrication of this transceiver significantly reduces labor and equipment costs as compared to thin film substrate assemblies. It will be evident that there are additional embodiments which are not illustrated above but which are clearly within the scope and spirit of the present invention. The above description and drawings are therefore intended to be exemplary only and the scope of the invention is to be limited solely by the appended claims.

We claim:

1. A device for transmitting and receiving Ku-band radiation fabricated using a thick film process which comprises:

a ceramic substrate with a plurality of feedthrough holes formed therethrough;

a conductive coating on said feedthrough holes formed by silkscreening a first conductive paste onto a top surface and a bottom surface of said ceramic substrate thereby forming a pattern centered on said feedthrough holes and drawing said first conductive paste into said feedthrough holes with a vacuum;

a first conductive pattern of traces, pads and elements formed by silk screening a second conductive paste onto said top surface and precisely controlling dimensions of said traces and elements by selectively etching said first conductive pattern;

a plurality of capacitors formed by silkscreening at least one layer of a dielectric paste onto said top surface over selected ones of said traces and elements of said first conductive pattern;

a top electrode for each capacitor formed by silkscreening a third conductive paste over said each capacitor;

a second conductive pattern of traces, pads and elements formed by silkscreening a third conductive paste over first selected portions of said first conductive pattern and top electrodes of said capacitors;

a ground plane formed by silkscreening a third conductive pattern on said bottom surface;

a plurality of resistors formed by silkscreening at least one layer of resistor paste over second selected portions of said first conductive pattern and first selected portions of said second conductive pattern said plurality of resistors with a laser;

a protective glass layer deposited over said capacitors; and a plurality of discrete integrated circuits attached to pads of said first and second conductive patterns and bonded with a conductive bond.

2. A device as in claim 1 wherein said plurality of discrete integrated circuits comprises a power amplifier, an LNA, a dual amplifier switch, an upconverter, a downconverter, a voltage controlled oscillator, a frequency divider and an HEMT.

3. A device as in claim 2 wherein said dual amplifier switch comprises an IF limiting amplifier, an amplifier and a switching means.

4. A device as in claim 2 wherein said upconverter comprises an RF balun, a mixer, an RF amplifier and an LO amplifier.

5. A device as in claim 2 wherein said upconverter comprises a means for amplifying an IF input signal, a means for amplifying an LO signal, a means for mixing an amplified IF signal and an amplified LO signal to produce an RF output, and a means for amplifying said RF output.

* * * * *